United States Patent
Yang et al.

(10) Patent No.: US 9,224,861 B2
(45) Date of Patent: Dec. 29, 2015

(54) SEMICONDUCTOR DEVICE WITH NOTCHED GATE

(71) Applicant: FREESCALE SEMICONDUCTOR, INC., Austin, TX (US)

(72) Inventors: Hongning Yang, Chandler, AZ (US); Pete Rodriguez, Tempe, AZ (US); Zhihong Zhong, Chandler, AZ (US); Jiang-Kai Zuo, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 120 days.

(21) Appl. No.: 13/890,402

(22) Filed: May 9, 2013

(65) Prior Publication Data

US 2014/0332901 A1 Nov. 13, 2014

(51) Int. Cl.
*H01L 29/78* (2006.01)
*H01L 29/66* (2006.01)

(52) U.S. Cl.
CPC ...... *H01L 29/7833* (2013.01); *H01L 29/66681* (2013.01)

(58) Field of Classification Search
None
See application file for complete search history.

(56) References Cited

U.S. PATENT DOCUMENTS

| 5,321,295 | A | * | 6/1994 | Hisamoto | ........... H01L 29/0696 257/133 |
|---|---|---|---|---|---|
| 7,851,889 | B2 | | 12/2010 | Zhu et al. | |
| 2010/0032754 | A1 | * | 2/2010 | Kawaguchi | ..... H01L 21/823418 257/337 |
| 2012/0098062 | A1 | * | 4/2012 | Pendharkar | ......... H01L 29/0653 257/337 |
| 2013/0037867 | A1 | * | 2/2013 | Adachi | ............. H01L 21/76224 257/288 |

OTHER PUBLICATIONS

Tahir Khan et al., "Rugged Dotted-Channel LDMOS Structure," Electron Devices Meeting, IEEE International, 4 pages, 2008.

* cited by examiner

*Primary Examiner* — Steven Loke
*Assistant Examiner* — Juanita Rhodes
(74) *Attorney, Agent, or Firm* — Jonathan N. Geld (57) ABSTRACT

A semiconductor device includes a semiconductor substrate, a body region disposed in the semiconductor substrate and having a first conductivity type, a source region disposed in the semiconductor substrate adjacent the body region and having a second conductivity type, a drain region disposed in the semiconductor substrate, having the second conductivity type, and spaced from the source region to define a conduction path, a gate structure supported by the semiconductor substrate, configured to control formation of a channel in the conduction path during operation, and having a side adjacent the source region that comprises a notch, the notch defining a notch area, and a notch region disposed in the semiconductor substrate in the notch area and having the first conductivity type.

20 Claims, 3 Drawing Sheets

SEMICONDUCTOR DEVICE WITH NOTCHED GATE

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode, as well as spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor device is a laterally diffused metal-oxide-semiconductor (LDMOS) transistor device. In an LDMOS device, a drift space is provided between the channel and the drain region.

Power devices are susceptible to the generation of secondary charge carriers through impact ionization. In an n-channel LDMOS transistor device, electrons may generate additional electron-hole pairs after being accelerated in a region having a high electric field, such as near the drain boundary. If a sufficient number of holes—the secondary charge carriers—are created to raise the potential of the body of the LDMOS transistor device to an extent that the junction with the source is forward biased, activation of a parasitic npn bipolar transistor formed via the source (emitter), body (base), and drain (collector) regions of the LDMOS transistor device can occur. Very large, damaging currents can result via the activation of the parasitic bipolar transistor, an operating condition referred to as "snapback."

LDMOS devices are often characterized by a "safe operating area" in which the operating current and voltage levels are below levels that would result in a snapback event. Attempts to remain within the safe operating area to avoid device destruction or other damage are often undesirably limiting factors for device operation and application.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Semiconductor devices with a notched gate are described. Electronic apparatus including such semiconductor devices, and methods of fabricating such devices and apparatus, are also described. The notched gates of the disclosed embodiments may be used to increase the safe operating area (SOA) of the semiconductor devices. The notched gates may be used to address the generation of secondary charge carriers in power transistor devices, such as LDMOS and other transistor devices. With an increased SOA, device damage arising from electrostatic discharge (ESD) and other events that may otherwise give rise to snapback may be avoided. The notched gates of the disclosed embodiments may achieve such SOA benefits with only modest increases in device on-resistance (e.g., Rdson*Area).

The notched gate of the disclosed embodiments may also suppress the onset of the Kirk effect in semiconductor devices. The Kirk effect is another possible source of device damage that can limit device SOA. The Kirk effect may be present in LDMOS transistor devices having a reduced surface field (RESURF) configuration. For instance, at high gate voltages and high current densities, the increasing amount of mobile charge present can alter the charge distribution in a RESURF drift region and reduce the depletion charge density. The voltage drop may thus shift toward the drain region due to the reduced charge density in the RESURF region that supports the large voltage load. This shift can cause a sharp rise in the electric field near the drain region, leading up to the onset of avalanche multiplication and causing a sudden increase in drain current. The increase in current can impact the drain region to trigger snapback and cause irreversible damage and breakdown.

The notched gates of the disclosed embodiments may be used to avoid having to resort to device size increases to address snapback and Kirk effect concerns. The notched gates of the disclosed embodiments may be used to suppress the Kirk effect without having to increase channel length or otherwise increase the on-resistance of the devices. In some embodiments, the notched gates of the disclosed embodiments may be configured to maintain a given SOA despite a decrease in channel length. Relatively lower on-resistances may thus be achieved.

As described below, a source-side edge of a gate is patterned to form regularly spaced notched areas. In some embodiments, a dopant implant, such as a P+ body contact implant, may be applied to the notched areas. Another dopant implant of opposite conductivity type, such as an N+ drain/source implant, may then be applied in areas between the notched areas. Source regions of the disclosed devices may be disposed along teeth of the gate that define the notches areas. The absence of the source region in the notched areas may present a low resistivity current path for secondary charge carriers (e.g., holes). The current path lowers the effective resistance of the body, which may delay snapback. The absence of the source region in the notched areas may also prevent the primary charge carriers of the channel (e.g., electrons) from passing through. Channel resistance may thus increase, thereby lowering drain current and effectively suppressing the Kirk effect.

The size of the notched areas may be adjusted to customize the device for a desired SOA and on-resistance. For example, the dimensions of the notched areas may be selected to tune the SOA and on-resistance. Alternatively or additionally, the spacing between the notched areas (e.g., the dimensions of the teeth along the gate edge) may be adjusted for further customization. Using these dimensions, the effects on the on-resistance may be balanced with the suppression of the Kirk effect and snapback.

Although described below in connection with n-channel LDMOS transistors, the disclosed devices are not limited to any particular transistor configuration. For instance, application of the features of the disclosed devices is not limited to LDMOS or other power MOS devices or other transistor devices. One or more features of the disclosed devices may be applied to other power device configurations. The notched gate of the disclosed devices may be useful in a wide variety of power electronic devices. The notched gate is also not limited to any one particular type of LDMOS configuration. For instance, the disclosed devices may have drift regions with various types of reduced surface field (RESURF) arrangements, including single, double, or other RESURF structural arrangements.

N-channel LDMOS devices and, thus, p-type conduction path regions are described and illustrated herein. While the improvements in SOA may be more beneficial in connection with n-channel devices (due to, e.g., less impact ionization in p-channel devices from the lower mobility of holes), the disclosed embodiments are not limited to n-channel devices. P-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

Figure 1:
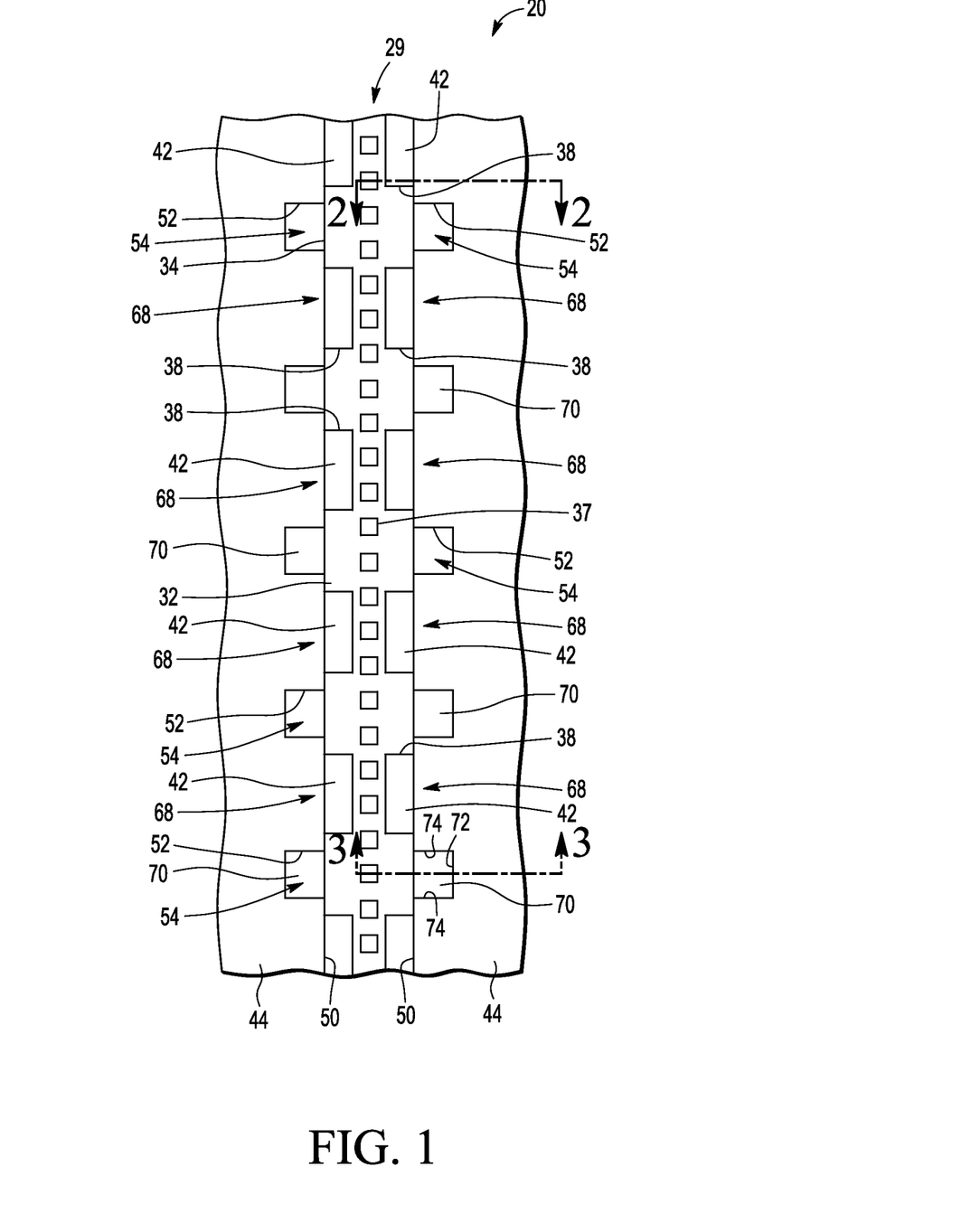
FIG. 1 is a top, schematic, partial view of an exemplary semiconductor device with a notched gate to provide an increased safe operating area in accordance with one embodiment.
Figure 2:
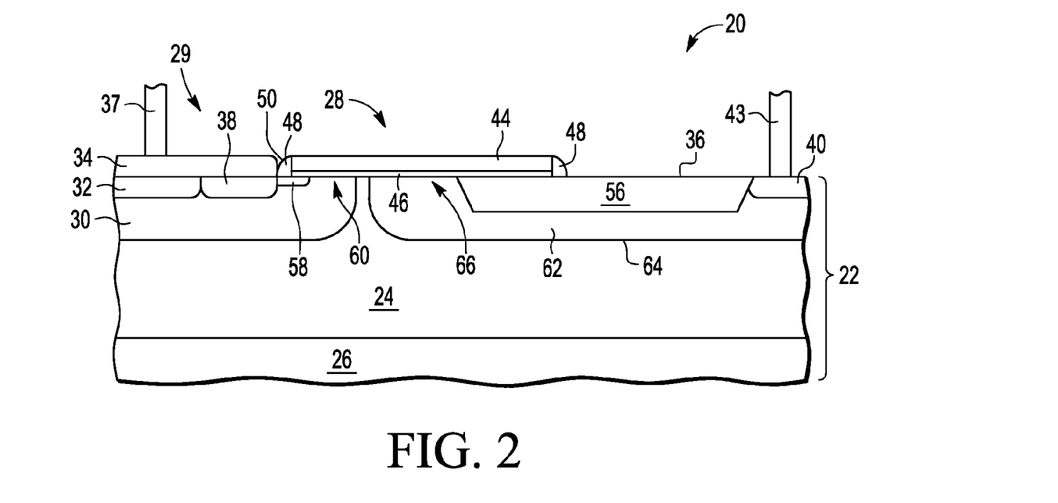
FIG. 2 is a cross-sectional, schematic, partial view of the semiconductor device of FIG. 1 taken along lines 2-2 of FIG. 1.
Figure 3:
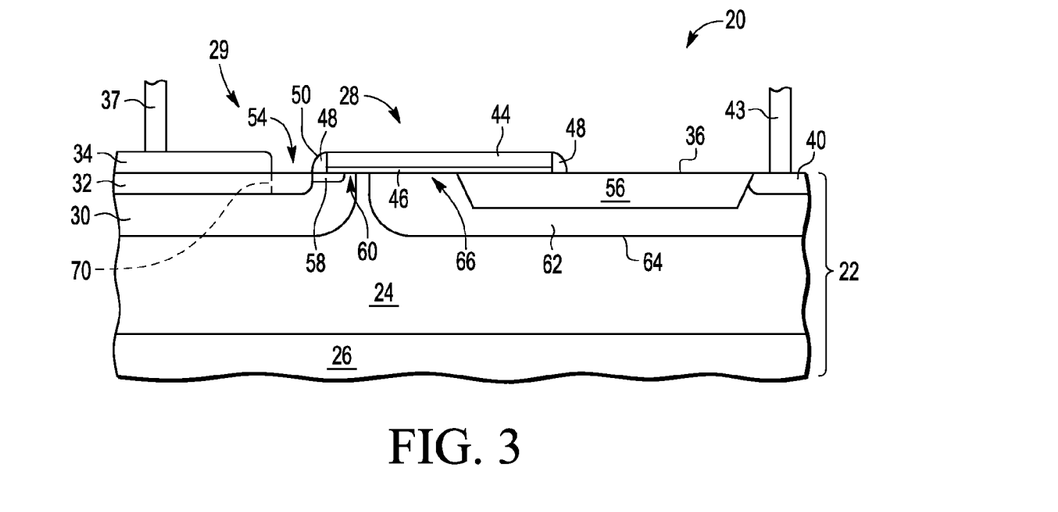
FIG. 3 is a cross-sectional, schematic, partial view of the semiconductor device of FIG. 1 taken along lines 3-3 of FIG. 1.

FIGS. 1-3 depict an n-channel LDMOS device 20 constructed in accordance with one embodiment. FIG. 1 is a partial, top view of the device 20 to show an exemplary layout of a notched gate arrangement. FIGS. 2 and 3 are partial, cross-sectional views of the device 20 to show an exemplary doping profile for the layout of the notched gate arrangement. The cross-sectional view of FIG. 2 is taken along lines 2-2 of FIG. 1 to depict the doping profile in a toothed area of the notched gate arrangement. The cross-sectional view of FIG. 3 is taken along lines 3-3 of FIG. 1 to depict the doping profile in a notched area of the notched gate arrangement.

As shown in FIGS. 2 and 3, the device 20 includes a semiconductor substrate 22. The semiconductor substrate 22 may, in turn, include a number of epitaxial layers 24. In this example, the semiconductor substrate 22 includes a single p-type epitaxial layer 24 grown on an original substrate 26. The original substrate 26 may be a heavily doped p-type substrate in some cases, such as those having multiple epitaxial layers. The device 20 may alternatively or additionally include non-epitaxial layers in which one or more device regions are formed. Any one or more of the layers of the semiconductor substrate 22 may include silicon. Alternative or additional semiconductor materials may be used in other embodiments. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 28 of the device 20 is depicted in FIGS. 2 and 3. In some embodiments, the device area 28 corresponds with only one side, half, or other portion of the device 20. For example, the device area 28 may be laterally symmetrical and, thus include a portion that mirrors the portion shown. In other embodiments, such lateral symmetry may support multiple devices (e.g., devices in addition and configured similarly to the device 20). For example, the device 20 may share one or more components (e.g., a source or drain region) with other devices. The portion of the device area 28 shown in FIGS. 2 and 3 may be replicated any number of times (e.g., 10, 20, or more times).

One example of such lateral symmetry is shown in the top view of FIG. 1. In this example, the device 20 (or devices) are symmetrical about a source-side area 29 of the device area 28 (FIGS. 2 and 3). In single device embodiments, the source-side area 29 is configured a central area of the device area 28. In multiple device embodiments, the devices share a common, central source-side area 29. In alternative embodiments, the device 20 (or devices) are symmetrical about a common or central drain-side area. Notwithstanding the foregoing description of alternative symmetrical embodiments, the disclosed embodiments are not limited to symmetrical layouts.

The device area 28 may be defined by one or more doped device isolating layers or regions (not shown) in the semiconductor substrate 22 (e.g., the epitaxial layer 24). The doped isolating layer(s) or region(s) may laterally and/or otherwise surround the device area 28. These layers or regions act as a barrier or isolation layer separating the device area 28 from the rest of the substrate 22 (or the original substrate 26). In some cases, a buried n-type layer may be formed or disposed in the semiconductor substrate 22. For example, the buried n-type layer may be formed in the semiconductor substrate 22 before the growth of the epitaxial layer 24 thereof. The buried n-type layer may extend laterally across (e.g., under) the device area 28 to act as a barrier or isolation layer separating the active area 28 from the original substrate 26. The buried n-type layer may constitute one of multiple doped device isolating regions (not shown) surrounding the device area 28. For example, a moderately or heavily doped n-type isolation well (not shown) may laterally surround the device area 28. The isolation well may be ring-shaped. The isolation well may be disposed on or otherwise above the buried n-type layer and outside of, or along, the lateral periphery of the device area 28. Any number of the device isolation wells, sinks, or buried layers may be connected to one another. Additional, fewer, or alternative device isolation layers or regions may be provided in the semiconductor substrate 22.

The device 20 includes a device body or body region 30 (Figures and 3) in the semiconductor substrate 22. In this embodiment, the body region 30 includes a p-type well formed in the epitaxial layer 24 of the substrate 22. The body region 30 may be biased via one or more heavily doped p-type body contact regions 32 disposed within or adjacent to the well of the body region 30. The body contact region(s) 32 may be patterned as shown in FIGS. 1-3 in accordance with the notched gate arrangement, as described further below. The dopant concentration of each body contact region 32 may be at a level sufficient to establish an ohmic contact with a silicide (or salicide) film 34 at a surface 36 (FIGS. 2 and 3) of the semiconductor substrate 22. One or more body contacts 37 may be disposed on the silicide film 34 to establish an electrode for the body region 30. In this example of FIG. 1, the device 20 includes multiple body contacts 37 centered over the body contact region 32.

The silicide film 34 may be patterned or shaped as a strip as shown in FIG. 1. The strip may extend laterally along the width of the device 20 in the source-side area 29. Other shapes or patterns may be used. For example, the silicide film 34 may have a shape that matches the notched gate arrangement. One or more metal layers deposited on the surface 36 to form the silicide film 34.

One or more metal layers may be deposited to form the body contacts 37. For example, The body contacts 37 may include a metal stack. In some embodiments, the metal stack includes one or more adhesion metal layers, one or more transition metal layers, and/or one or more primary conduction metal layers. Any number of the body contacts 37 may be provided. The body contacts 37 may have any shape, and are not limited to the square shapes shown. The lateral positioning and/or arrangement of the body contacts 37 may also vary from the example shown. For instance, the body contacts 37 need not be arranged in a single line. In some embodiments, one or more additional contacts may be provided specifically for the source region 38, including, for instance, those embodiments in which the source region 38 and the body contact region 42 do not abut one another as shown.

As best shown in FIG. 2, the device 20 includes heavily doped source and drain regions 38 and 40 in the semiconductor substrate 22. In this example, the source and drain regions 38 and 40 are n-type doped portions of the epitaxial layer 24. The source and drain regions 38 and 40 are laterally spaced from one another in the lateral dimension shown in the cross-section of FIG. 2. That lateral dimension may be considered the length of the device 20. Such lateral spacing defines a conduction path of the device 20. The conduction path may thus be oriented along the lateral dimension shown in FIG. 1. In some embodiments, the source and drain regions 38 and 40 may have additional or alternative lateral spacing. The drain region 40 is not shown in FIG. 1. One or more drain regions 40 may be disposed laterally outward from the central, source-side area 29 shown in FIG. 1. In alternative embodiments, a single drain region 40 is centered or otherwise disposed between, or laterally surrounded by, the source region 38.

In a typical LDMOS configuration, the drain region 40 is biased at a relatively high drain-source voltage, Vds, relative to the source region 38 to support the flow of the primary charge carriers along the conduction path. The source and drain regions 38, 40, or respective portions thereof, may have a dopant concentration at a level sufficient to establish ohmic contacts for biasing the source region 38 and the drain region 40. In this embodiment, the ohmic contacts for the constituent source regions 42 are established with the silicide film 34. Silicide may also be disposed along the surface 36 for the drain region 40 to form an electrode with a drain contact 43. Upon application of the drain-source voltage (and a suitable gate bias voltage) to the drain contact 43, the primary charge carriers (e.g., electrons) flow along the conduction path from the source region 38 to the drain region 40.

The source region 38 may be disposed within or adjacent the well of the body region 30 (FIG. 2). As best shown in FIG. 1, the source region 38 may be patterned into a number of constituent source regions 42. Each constituent source region 42 may be disposed adjacent the body contact region 36 as shown in FIGS. 1 and 2. The source region 38 may thus be configured as a composite source region. The constituent source regions 42 are distributed and spaced from one another along a lateral direction or dimension transverse to the lateral dimension shown in the cross-sections of FIGS. 2 and 3. The constituent source regions 42 may be distributed along the width of the device 20. Any number of constituent source regions 42 may be provided.

The device 20 includes one or more gate structures 44 supported by the semiconductor substrate 22. The gate structure(s) 44 are configured to control formation of a channel in the conduction path during operation. The gate structure(s) 44 may be formed on or above the surface 36 of the semiconductor substrate 22. Each gate structure 44 is disposed between the source region 38 and the drain region 40. In the example of FIG. 1, the gate structure 44 surrounds the source region 38 (or source-side area 29). Alternatively, a pair of gate structures 44 may be configured in a dual gate finger arrangement in which two transistors are symmetrically arranged to share the same source region 38. Other multiple gate finger embodiments having any number of gate fingers are possible.

The gate structure 44 may include a gate dielectric layer 46 on the surface 36. For example, the gate dielectric layer 46 may include silicon dioxide (or oxide) deposited or otherwise formed on the surface 36. Each gate structure 44 includes a conductive gate layer (e.g., a polysilicon plate) on or above the gate dielectric layer, which insulates the conductive gate layer from the semiconductor substrate 22.

The gate structure 44 may include one or more dielectric sidewall spacers 48 (FIGS. 2 and 3) disposed along lateral edges of the gate structure 44. The sidewall spacers 48 may cover the lateral edges to act as a silicide blocker to prevent a silicide short along the surface 36. For example, the sidewall spacers 48 may provide spacing to separate the conductive components of the gate structure 44 from the source region 38, the body contact region 32, and/or other regions of the device region 28. In this example, one of the sidewall spacers 48 is used for alignment purposes in defining an inner boundary of each constituent source region 42.

As shown in FIG. 1, a side 50 (or edge) of the gate structure 44 adjacent the source region 38 includes one or more notches 52. The side 50 is oriented along a direction or dimension transverse to the direction of the conduction path. For instance, the side 50 may be oriented along the width direction or dimension of the device 20. The notches 52 may thus be distributed along the width dimension of the device 20. In this embodiment, the distribution of the notches 52 is regular. Each notch 52 defines a notch area 54 of the semiconductor substrate 22 the doping of which is described further below.

Other characteristics of the configuration of the gate structure 44 may vary. For example, the configuration of the gate structure 38 may include multiple conductive layers (e.g., polysilicon plates). Other characteristics, such as the components, materials, and shape, of the gate structure 44 may vary from the example shown.

As shown in FIGS. 2 and 3, a number of shallow trench isolation (STI) regions 56 may be formed at the surface 36 in the semiconductor substrate 22. In this embodiment, an STI region 56 spaces the gate structure 44 from the high voltage applied to the drain region 40. The STI region 56 may be configured to prevent or minimize hot carrier injection (HCI) into the oxide layer of the gate structure 44. In some cases, another STI region 56 may be disposed between the body contact region 32 and the source region 38. The body contact region 32 and the source region 38 thus need not abut one another as shown. Other STI regions 56 may be disposed in the semiconductor substrate 22 to isolate or separate various contact regions, such as other regions for biasing components of the device 20. For example, an isolation contact region and a substrate contact region may be separated by an STI region 56.

The device 20 may include one or more lightly or intermediately doped transition, extension regions, or other current terminal extension regions 58 at or near the source and drain regions 38 and 40 (e.g., n-type lightly doped drain, or NLDD, regions). In the embodiment of FIGS. 2 and 3, the source region 38 has an NLDD extension region 58 adjacent the heavily doped portion of the source region 38. The NLDD region 52 may be considered a portion of the source region 38.

Each NLDD or other extension region 58 may be or include a diffused region formed in connection with the source region 38 and/or the drain region 40. The diffused region may extend under the gate structure 44 as shown. The NLDD or other extension regions 58 may assist in controlling the electric field at or near the surface 36, including in areas other than those areas near the source region 38 or the drain region 40.

When the gate structure 44 is biased, charge carriers (in this case, electrons; alternatively, holes) accumulate in one or more channel areas or regions 60 (FIGS. 2 and 3). Each channel region 60 (or a portion thereof) may be formed during operation in the well of the body region 30 under the gate structure 44. In this example, the accumulation of electrons results in charge inversion in the channel region 60 from the p-type well of the body region 30 to an n-type conduction layer or area (or other n-channel) near the surface 36 of the semiconductor substrate 22. Once a sufficient amount of the charge carriers accumulate in the conduction layer or area, charge carriers are capable of flowing from the source region 38 toward the drain region 40 through the channel region 60.

The channel region 60 may include other regions or areas in the semiconductor substrate 22 in which charge inversion or accumulation occurs as a result of the bias applied to the gate structure 44. Charge carriers may also accumulate outside of or beyond the body region 30. For example, charge carriers may accumulate in a region of the epitaxial layer 24 adjacent the body region 30. This area and the channel region 60 may form part of the conduction region or path of the device 20 for the primary charge carriers (e.g., electrons). The conduction path may thus be referred to as a primary conduction path or region.

The primary conduction path of the device 20 is not limited to regions in which charge inversion occurs or to regions in which conduction is enabled or enhanced via the bias voltage applied to the gate structure 44. The primary conduction path or regions of the device 20 are thus not limited to regions at or near the surface 36. For example, the primary conduction path includes a portion of a drift region 62 through which charge carriers drift to reach the drain region 40. The drift region 62 is disposed in the semiconductor substrate 22 along the conduction path to configure the device 20 as an LDMOS transistor device. In this example, the drift region 62 corresponds with a portion of an n-type well 64 that extends across and under the STI region 56.

The n-type well 64 of the drift region 62 may laterally extend under the gate structure 44 to form an accumulation region 66 of the device 20. The accumulation region 66 may be disposed along the surface 36 rather than under the STI region 56. During operation, charge carriers accumulate in the accumulation region 66 before drifting through the drift region 62. The primary conduction path of the device 20 may thus include additional or alternative areas or regions having a different conductivity type than the body region 30.

In the embodiment of FIG. 1, the drift region 62 is configured as a field drift region. The STI region 56 is disposed between the accumulation region 66 and the drain region 40. Alternative or additional field isolation structures may be disposed between the accumulation region 66 and the drain region 40. The field isolation structures may include one or more field plates disposed above the surface 36. The device 20 need not include the STI region 56 along the drift region 62, and may thus be configured as an active drift device in alternative embodiments.

The primary conduction path or regions of the device 20 may include or be adjacent to still further regions, whether n-type or p-type, at, near, or spaced from the surface 36. For example, one or more RESURF regions may be disposed along the drift region 62 in the semiconductor substrate 22. Such RESURF regions may be used to ensure the depletion of the drift region 62 near the drain region 40.

The path along which the charge carriers flow from the source region 38 to the drain region 40 passes through the drift region 62 in the semiconductor substrate 22. The drift region 62 may be configured to allow the charge carriers to drift under the electric field established by the drain-source voltage applied between the drain region 40 and the source region 38. The drift region 62 (or one or more portions thereof) thus forms part of the conduction path of the device 20. During operation, the drift region 62 electrically couples the drain region 40 to the channel region 60 and the source region 38.

With reference again to FIG. 1, the notched areas 54 along the side 50 of the gate structure 44 adjacent the source region 38 are defined by a number of teeth 68 of the notched gate arrangement. In this example, each constituent source region 42 is adjacent one of the teeth 68. Each constituent source region 42 does not extend in the width dimension or direction beyond the respective tooth 68 to which the constituent source region 42 is adjacent. In this embodiment, each constituent source region 42 is surrounded by the body contact region 32 along each side not adjacent the gate structure 44. Like the notched areas 54, the constituent source regions 42 and the teeth 68 may be distributed along the width dimension regularly. In the embodiment of FIGS. 1-3, the device 20 has a dopant profile sequence along the width dimension that alternates between source and body contact regions. For example, the N+ and P+ regions alternate along the width of the device 20. The constituent source regions 42 and the notched areas 54 need not be disposed at intervals having the same size. For example, each tooth 68 need not have one of the constituent source regions 42 adjacent thereto.

As shown in FIGS. 1 and 3, a notch region 70 is disposed in the semiconductor substrate 22 in each notch area 54. Each notch region 70 is disposed between a respective pair of the teeth 68 of the gate structure 44. The notch region 70 has the conductivity type (e.g., p-type conductivity) of the body region 30. In this example, the body contact region 32 includes the notch region 70. Each notch region 70 may be formed as a portion of the body contact region 32 despite the lack of silicide coverage at the surface 36 over the notch region 70. In this example, the silicide film 34 runs along the side 50 of the gate structure 44 to cover the constituent source regions 42 and those portions of the body contact region 32 outside of the notched areas 54. The notch region 70 is shown in FIG. 3 as an inner portion of the body contact region 32. The point at which the notch region 70 meets the remainder of the body contact region 32 is indicated in FIG. 3 by a dashed line. As shown in FIG. 1, the other boundaries of each notched area 74 (and each corresponding notch 52 and notch region 70) are defined along the side 50 of the gate structure 44 by an inner sidewall 72 and a pair of lateral sidewalls 74 that extend laterally outward from the inner sidewall 72. The sidewalls 74 define the edges of one of the teeth 68. The sidewalls 72, 74 need not be disposed in a rectilinear arrangement as shown.

The notch region 70 may have a dopant profile that corresponds with the doping of the entirety of the notched area 54. For instance, a dopant implantation procedure, such as one directed to forming the body contact region 32, may use the gate structure 44 as a mask. Each notch region 70 may thus be self-aligned with the gate structure 44 and each notched area 54 defined thereby. The notch region 70 may have a channel-side boundary that matches the boundary of the side 50 of the gate structure 44. Alternatively, a mask for the dopant implantation procedure has a layout that deviates from the gate structure 44 to, for instance, restrict the implant to a portion of the notched area 54. In some cases, the notch region 70 may include one or more sections doped by the implants for the body region 30 and the body contact region 32 and one or more other sections doped only by the implant for the body region 30.

The size and distribution of the notch regions 70 (and/or notched areas 54) may be adjusted to customize the effects on SOA, the Kirk effect, on-resistance, and/or other device performance characteristics. For instance, as the spacing between the notch regions 70 increases, the suppression of the Kirk effect is reduced because more current is allowed to flow. On the other hand, as the spacing decreases, the operating current of the device 20 decreases. The spacing and the notch size may be used to balance these effects. In some embodiments, the lateral width of each notch region 70 (and/or notched area 54) falls in a range from about 0.2 µm to about 2 µm, although other lateral widths may be used. The lateral spacing between adjacent notch regions 70 (and/or notched areas 54) may fall in a range from about 0.5 µm to about 2 µm, although other spacings may be used. The length in the lateral dimension shown in the cross-sections of FIGS. 2 and 3 of each notch region 70 (and/or notched area 54) may be selected to be less than the lateral channel length. For example, the length may fall in a range from about 0.1 µm to about 0.3 µm, although other lengths may be used.

The shapes of the teeth 68 and the notched areas 42 may vary from the example shown. For example, the gate structure 44 along the side 50 may have a sawtooth pattern. Each notched area 42 may have a trapezoidal or triangular shape. Any number of notches may be provided along the side 50.

In an alternative embodiment, the notch region 70 is not part of the body contact region 32, but nonetheless doped opposite the source region 38. For example the notch region 70 may be formed via one or more implantation procedures other than the procedure directed to forming the body contact region 32. For example, each notch region 70 may be a portion of the well of the body region 30. Alternatively or additionally, each notch region 70 may be configured as a lightly, intermediately, or moderately doped region formed via an implantation procedure directed to forming PLDD or other p-type extension regions. Additional or alternative implantation procedures may be used to increase the dopant concentration level of the notch regions 70 from the level of the epitaxial layer 24 and/or the level attained via the implantation procedure for the body region 30.

The operation of the notched field drift devices described above may be represented via the following equations. The on-resistance (Rdson*Area) and drain current expressions are modified by the width of the notch, $W_{notch}$, as follows:

$$Rdson * Area = \left[ \frac{L_{ch}/L_{drift}}{\mu C_{ox}(V_{gs}-Vt)} \frac{W}{W_{notch}} + r_{drift} \right](L_{ch}+L_{drift})L_{drift}$$

$$I_{dlin} = \mu C_{ox} \frac{W_{notch}}{L_{eff}}(V_{gs}-Vt)V_{ds},$$

where $$L_{eff} = L_{ch} + \mu C_{ox} W_{notch}(V_{gs}-Vt)R_{drift}$$

$$I_{dsat} = \mu C_{ox} \frac{W_{notch}}{2L_{ch}}(V_{gs}-Vt)^2$$

where Lch is the lateral channel length, Ldrift is the drift region length, W is the width of the device perpendicular to the lateral channel length, rdrift is the drift region sheet resistance, and Rdrift is the total drift region resistance.

As shown in the above-described representations, reducing Wnotch can significantly lower the saturation drain current Idsat, which may suppress the Kirk effect. The on-resistance may only increase modestly if the channel length Lch is significantly lower than the length of the drift region Ldrift (e.g., for high voltage LDMOS transistor devices).

In one LDMOS example, the notched gate arrangement increased the SOA from 75 to 90 Volts (with the gate-source bias voltage Vgs at 5.5 Volts and a channel length of 0.6 µm) in exchange for an increase in on-resistance of about 10%. The dimensions of the notched gate arrangement were as follows: a notch length (depth) of about 0.2 µm; a notch width of about 0.98 µm; and, a notch spacing of about 1.7 µm.

In another LDMOS example, the notched gate arrangement was used to approximately maintain a given SOA (113 to 110 Volts), while allowing channel length to drop from 1.5 to 0.6 µm, which resulted in a 25% drop in on-resistance and corresponding device area savings. The dimensions of the notched gate arrangement were as follows: a notch length (depth) of about 0.2 µm; a notch width of about 2.32 µm; and, a notch spacing of about 1.7 µm.

Any one or more of the dimensions and/or other characteristics of the notched gate arrangements may vary considerably from the examples described above.

The source regions of the above-described embodiments need not include a transition or extension region, or have one associated therewith. The source regions need not include an extension or transition region that extends laterally outward (e.g., toward or into the channel) or that extends under the region doped by the source/drain implant. For instance, the embodiments described and shown in connection with FIGS. 1-3 need not have an extension region, such as the NLDD region 58. In such cases, the spacers 48 may be less wide to allow the source implant to laterally diffuse under the spacer 48. Alternatively or additionally, a tilt implant may be used for the source region.

The source region 38 need not be configured as a composite source region. For example, in some embodiments, the source region 38 is patterned such that the areas along the teeth 68 are linked via additional areas in which dopant (e.g., n-type dopant) is implanted.

The above-described devices are shown in simplified form. For example, FIGS. 1-3 do not show all of the contacts and other conductive (e.g., metal) layers or structures configured for electric coupling with the source regions, the drain regions, and the gate structures. The devices may have a number of other structures or components for connectivity, isolation, passivation, and other purposes not shown in the figures for ease in illustration. For instance, the devices may include any number of additional doped isolating regions (e.g., an isolation ring) or layers (e.g., a buried isolation layer). In some examples, another p-type epitaxial layer (not shown) may be disposed between the original substrate and the device area. One or more further STI regions, other isolation trenches, and/or isolation wells (not shown) may be provided to isolate the device area and/or other region of the device.

The dopant concentrations, thicknesses, and other characteristics of the above-described semiconductor regions in the semiconductor substrate 22 may vary. In one example of the embodiment shown in FIGS. 1-3, the above-referenced semiconductor regions may have the following approximate concentrations and thicknesses:

|  | Concentration | Thickness |
| --- | --- | --- |
| epitaxial 24: | $1 \times 10^{13}$-$1 \times 10^{15}$/cm$^3$ | 3-10 μm |
| substrate 26: | $1 \times 10^{15}$-$1 \times 10^{19}$/cm$^3$ | not applicable |
| well 30: | $1 \times 10^{15}$-$5 \times 10^{18}$/cm$^3$ | 0.5-2.0 μm |
| contact 32: | $1 \times 10^{21}$-$5 \times 10^{21}$/cm$^3$ | 0.15-0.25 μm |
| source 38: | $1 \times 10^{21}$-$5 \times 10^{21}$/cm$^3$ | 0.15-0.25 μm |
| drain 40: | $1 \times 10^{21}$-$5 \times 10^{21}$/cm$^3$ | 0.15-0.25 μm |
| NLDD 58: | $5 \times 10^{17}$-$1 \times 10^{19}$/cm$^3$ | 0.1-0.3 μm |
| drift 62: | $1 \times 10^{15}$-$5 \times 10^{17}$/cm$^3$ | 0.5-2.5 μm |
| notch 70: | $1 \times 10^{21}$-$5 \times 10^{21}$/cm$^3$ | 0.15-0.25 μm |

The concentrations and thicknesses may be different in other embodiments. For example, the dopant concentration of the original substrate 26 may vary considerably. Any dopant materials may be used to form the above-described semiconductor regions in the semiconductor substrate 22.

Figure 4:
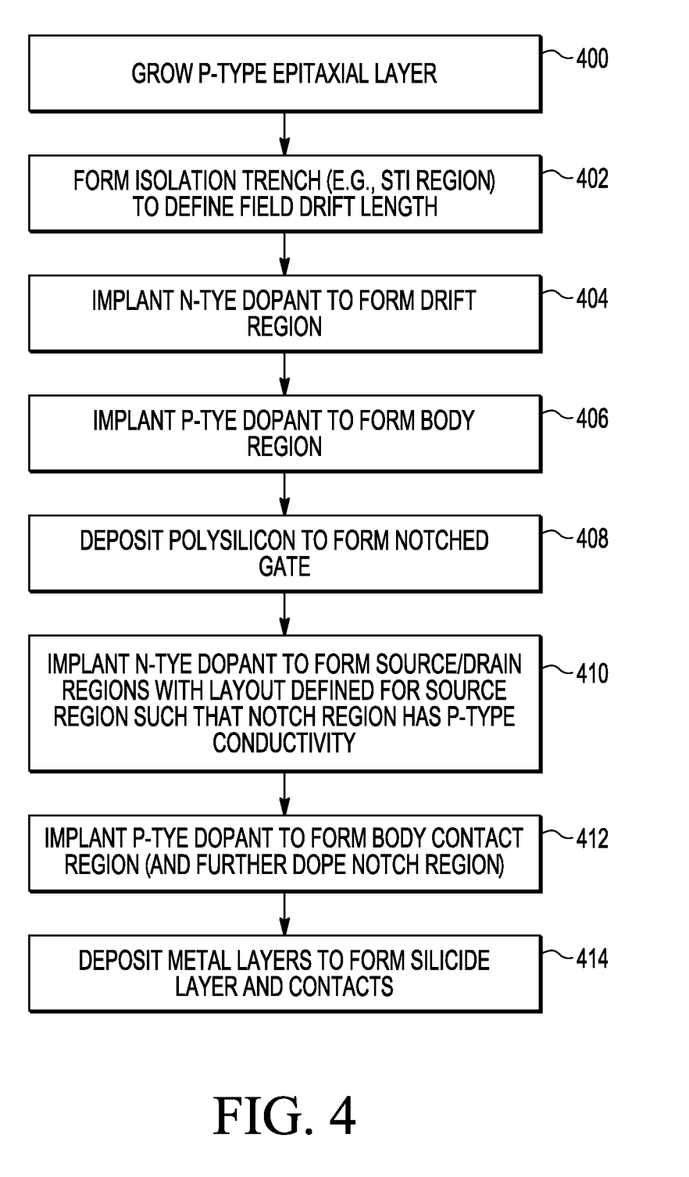
FIG. 4 is a flow diagram of an exemplary fabrication sequence to construct a semiconductor device having a notched gate in accordance with one embodiment.

FIG. 4 shows an exemplary fabrication method for fabricating a semiconductor device with an improved SOA as described above. The method may be directed to fabricating a transistor device, such as a power FET device (e.g., an LDMOS device) having one or more of the features described above. The transistor device is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. For example, the drift region may be formed after the body region. The fabrication method is not limited to any particular doping mechanism, and may include future developed doping techniques.

The method may begin with, or include, an act 400 in which a p-type epitaxial layer is grown on a heavily doped p-type semiconductor substrate. In some cases, the act 400 includes the formation via, e.g., ion implantation, of one or more buried device isolation layers before the growth of the epitaxial layer. The buried device isolation layer(s) may be configured via a mask to extend across an active area of the transistor device. In some cases, the act 400 includes the growth of another p-type epitaxial layer. Any number of epitaxial layers may be grown. Alternatively, no epitaxial layers are grown.

In this embodiment, a number of STI regions are formed in the substrate in act 402. The STI regions may include an STI region (or field isolation region) to define the field drift length, and one or more STI regions to separate various contact regions. The STI regions may be formed via any now known or hereafter developed procedure. For example, the act 402 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, one or more of the STI regions are formed after the drift region is formed.

In act 404, the substrate is doped to form a well in the epitaxial layer for the accumulation region and the drift region of the transistor device. The well is an n-type well in n-channel embodiments. The doping may include one or more n-type dopant implantation procedures. A well of a body region may be formed in the substrate in an act 406. The act 406 may include a p-type implantation procedure. The characteristics of the well regions may vary. For example, the well may be spaced from a well of the device body. In other embodiments, the boundary of the well may be line-on-line with a boundary of the device body.

The fabrication process may then include one or more procedures collectively shown in act 408 and directed to forming a gate structure. A gate oxide layer of the gate structure may be deposited or grown on a surface of the semiconductor substrate. A polysilicon or other conductive layer of the gate structure may then be deposited on the gate oxide layer. The gate structure is patterned to form the notched gate arrangement described above. The notched gate arrangement includes one or more notches, each notch defining a notched area, as described above. The layers of the gate structure may be patterned via various photolithography and etch procedures.

Additional or alternative procedures may be implemented in the act 408. For example, one or more dopant implantation procedures may be implemented, including a procedure directed to forming an NLDD or other extension region at the source-side of the gate structure. Sidewall spacers of the gate structure may then be formed after implementation of the NLDD or other implant. The material(s), size, shape, and other characteristics of the sidewall spacers may vary.

Source and drain regions may then be formed in the semiconductor substrate in an act 410 via a source/drain implantation procedure. One or more n-type ion implantation procedures may be performed. The source and drain regions are spaced apart from one another as described above. The source region is formed within or adjacent the well of the body region. The source region is positioned such that the side (or edge) of the gate structure having the notch (or notches) is adjacent the source region.

The act 410 includes defining a layout of the source region such that a notch region in each notch area has the conductivity type of the body region (e.g., p-type conductivity). A mask may be used to pattern the source region such that dopant (e.g., n-type dopant) is not implanted in the notch area(s). A p-type notch region may thus be formed or defined in each notch area. The mask may also configure the source region as a composite source region having a number of constituent source regions distributed and spaced from one another along a lateral direction (e.g., the width dimension) transverse to a conduction path of the device. The constituent source regions may be disposed at or along teeth of the notched gate arrangement, as described above. The teeth of the gate structure may thus be used for self-alignment of an edge of the source region. In some embodiments, each constituent source region does not extend in the width dimension beyond a respective tooth to which the constituent source region is adjacent, as described above.

In an act 412, a body contact region is formed in the semiconductor substrate via, e.g., a p-type dopant implantation procedure. In some embodiments, a portion of the body contact region is disposed in each notch area to form a respective notch region. A mask used for the dopant implantation procedure may be configured such that dopant (e.g., p-type dopant) is implanted in each notched area to form a notch region with a P+ dopant concentration level. The gate structure may be used as a mask for self-alignment with the side (or edge) of the gate structure having the notched areas. The mask may also be configured such that dopant is not implanted in the area(s) of the source region.

One or more metal layers may be deposited in an act 414 to form a silicide film (or salicide layer) over the source and body contact regions. The act 414 may also include the deposition of one or more further metal layers to form contacts for the source, body contact, and drain regions. A variety of metals may be used.

Additional acts may be implemented at various points during the fabrication procedure. For example, one or more acts may be directed to defining an active area of the device. In some cases, such acts may include the formation of one or more device isolating wells, layers, or other regions. One or more passivation layers may be deposited. Any number of additional STI regions may be formed.

In a first aspect, a semiconductor device includes a semiconductor substrate, a body region disposed in the semiconductor substrate and having a first conductivity type, a source region disposed in the semiconductor substrate adjacent the body region and having a second conductivity type, a drain region disposed in the semiconductor substrate, having the second conductivity type, and spaced from the source region to define a conduction path, a gate structure supported by the semiconductor substrate, configured to control formation of a channel in the conduction path during operation, and having a side adjacent the source region that comprises a notch, the notch defining a notch area, and a notch region disposed in the semiconductor substrate in the notch area and having the first conductivity type.

In a second aspect, an electronic apparatus includes a semiconductor substrate and a field-effect transistor device in the semiconductor substrate. The field-effect transistor device includes a first semiconductor region having a first conductivity type, a second semiconductor region adjacent the first semiconductor region and having a second conductivity type, a third semiconductor region having the second conductivity type and spaced from the second semiconductor region to define a conduction path, a gate structure supported by the semiconductor substrate, configured to control formation of a channel in the conduction path during operation, and having a side adjacent the second semiconductor region that comprises a plurality of notches, each notch defining a respective notch area, and a plurality of fourth semiconductor regions having the first conductivity type, each fourth semiconductor region being disposed in one of the notch areas.

In a third aspect, a method of fabricating semiconductor device includes forming a body region in a semiconductor substrate, the body region having a first conductivity type, forming a gate structure supported by the semiconductor substrate, and forming source and drain regions spaced apart from one another in the semiconductor substrate, the source region being disposed adjacent the body region, the source and drain regions having a second conductivity type. The gate structure has a side adjacent the source region that includes a notch, the notch defining a notch area. Forming the source and drain regions includes defining a layout of the source region such that a notch region in the semiconductor substrate in the notch area has the first conductivity type.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A semiconductor device comprising:
    a semiconductor substrate;
    a body region disposed in the semiconductor substrate and having a first conductivity type;
    a source region disposed in the semiconductor substrate adjacent the body region and having a second conductivity type;
    a drain region disposed in the semiconductor substrate, having the second conductivity type, and laterally spaced from the source region along a major surface of the semiconductor substrate to define a conduction path;
    a gate structure supported by the semiconductor substrate, configured to control formation of a channel in the conduction path during operation, and having a side adjacent the source region that comprises a notch, the notch defining a notch area; and
    a notch region disposed in the semiconductor substrate in the notch area and having the first conductivity type, wherein a channel length is less in portions of the conduction path beneath the gate structure having the notch region than a channel length is in portions of the conduction path beneath the gate structure not having the notch region.

2. The semiconductor device of claim 1, wherein:
    the body region comprises a well within which the source region and a body contact region are disposed; and
    the body contact region comprises the notch region.

3. The semiconductor device of claim 1, wherein:
    the conduction path is oriented along a first lateral direction; and
    the side of the gate structure comprising the notch is oriented along a second lateral direction transverse to the first lateral direction.

4. The semiconductor device of claim 3, wherein:
    the source region is one of a plurality of constituent source regions of a composite source region; and
    the plurality of constituent source regions are distributed and spaced from one another along the second lateral direction.

5. The semiconductor device of claim 4, wherein:
    the side of the gate structure comprises a plurality of teeth to define a plurality of notches including the notch; and
    each constituent source region does not extend in the second lateral direction beyond a respective tooth of the plurality of teeth to which the constituent source region is adjacent.

6. The semiconductor device of claim 1, wherein the notch is one of a plurality of notches in the side of the gate structure adjacent the source region.

7. The semiconductor device of claim 6, wherein the plurality of notches are regularly distributed along the side of the gate structure.

8. The semiconductor device of claim 6, wherein a lateral spacing between adjacent notches of the plurality of notches falls in a range from about 0.5 μm to about 2 μm.

9. The semiconductor device of claim 6, wherein a lateral width of each notch falls in a range from about 0.2 μm to about 2 μm.

10. The semiconductor device of claim 1, wherein the side of the gate structure includes, for each notch, an inner sidewall and a pair of lateral sidewalls that extend laterally from the inner sidewall in a rectilinear arrangement.

11. An electronic apparatus comprising:
a semiconductor substrate; and
a field-effect transistor device in the semiconductor substrate, the field-effect transistor device comprising:
a first semiconductor region having a first conductivity type;
a second semiconductor region adjacent the first semiconductor region and having a second conductivity type;
a third semiconductor region having the second conductivity type and laterally spaced from the second semiconductor region along a major surface of the semiconductor substrate to define a conduction path;
a gate structure supported by the semiconductor substrate, configured to control formation of a channel in the conduction path during operation, and having a side adjacent the second semiconductor region that comprises a plurality of notches, each notch defining a respective notch area; and
a plurality of fourth semiconductor regions having the first conductivity type, each fourth semiconductor region being disposed in one of the notch areas, wherein a channel length is less in portions of the gate structure having a notch region disposed in the semiconductor substrate in the notch area than a channel length is in portions of the gate structure not having the notch region.

12. The electronic apparatus of claim 11, wherein the fourth semiconductor regions are regularly distributed along the side of the gate structure.

13. The electronic apparatus of claim 11, wherein:
the first semiconductor region comprises a well within which the second semiconductor region and a contact region for the first semiconductor region are disposed; and
the contact region comprises the plurality of fourth semiconductor regions.

14. The electronic apparatus of claim 11, wherein:
the conduction path is oriented along a first lateral direction; and
the side of the gate structure comprising the plurality of notches is oriented along a second lateral direction transverse to the first lateral direction.

15. The electronic apparatus of claim 14, wherein:
the second semiconductor region is one of a plurality of constituent source regions of a composite source region; and
the plurality of constituent source regions are distributed and spaced from one another along the second lateral direction.

16. The electronic apparatus of claim 15, wherein:
the side of the gate structure comprises a plurality of teeth to define the plurality of notches; and
each constituent source region does not extend in the second lateral direction beyond a respective tooth of the plurality of teeth to which the constituent source region is adjacent.

17. A method of fabricating semiconductor device, the method comprising:
forming a body region in a semiconductor substrate, the body region having a first conductivity type;
forming a gate structure supported by the semiconductor substrate; and
forming source and drain regions laterally spaced apart from one another along a major surface of the semiconductor substrate in the semiconductor substrate, the source region being disposed adjacent the body region, the source and drain regions having a second conductivity type;
wherein the gate structure has a side adjacent the source region that comprises a notch, the notch defining a notch area; and
wherein forming the source and drain regions comprises defining a layout of the source region such that a notch region in the semiconductor substrate in the notch area has the first conductivity type, wherein a channel length is less in portions of the conduction path beneath the gate structure having the notch region than a channel length is in portions of the conduction path beneath the gate structure not having the notch region.

18. The method of claim 17, further comprising forming a body contact region in the semiconductor substrate and having the first conductivity type, a portion of the body contact region being disposed in the notch area to form the notch region.

19. The method of claim 17, wherein:
the layout of the source region is configured such that the source region is one of a plurality of constituent source regions of a composite source region; and
the plurality of constituent source regions are distributed and spaced from one another along a first lateral direction transverse to a conduction path of the semiconductor device defined by the source and drain regions.

20. The method of claim 19, wherein:
the side of the gate structure comprises a plurality of teeth to define the notch; and
each constituent source region does not extend in the first lateral direction beyond a respective tooth of the plurality of teeth to which the constituent source region is adjacent.

* * * * *